United States Patent [19]

Miyamoto et al.

[11] Patent Number: 5,442,231
[45] Date of Patent: Aug. 15, 1995

[54] SEMICONDUCTOR DEVICE

[75] Inventors: Takashi Miyamoto; Hitoshi Fujimoto, both of Itami, Japan

[73] Assignee: Mitsubishi Denki Kabushiki Kaisha, Tokyo, Japan

[21] Appl. No.: 953,705

[22] Filed: Sep. 30, 1992

[30] Foreign Application Priority Data

Oct. 1, 1991 [JP] Japan .................. 3-253833

[51] Int. Cl.6 .............. H01L 23/48; H01L 29/44; H01L 29/52; H01L 29/60
[52] U.S. Cl. .................. 257/668; 257/666; 257/690; 257/692; 257/784; 257/786
[58] Field of Search ............ 257/667, 777, 786, 668, 257/671, 666, 690, 673, 664, 784, 692; 437/220; 174/52

[56] References Cited

U.S. PATENT DOCUMENTS

| | | | |
|---|---|---|---|
| 3,387,365 | 6/1968 | Stelmak | 29/628 |
| 3,484,534 | 12/1969 | Kilby et al. | 174/52 |
| 3,838,984 | 10/1974 | Crane et al. | 257/668 |
| 4,138,691 | 2/1979 | Bonkohara et al. | 357/70 |
| 4,300,153 | 11/1981 | Hayakawa et al. | 357/80 |
| 4,796,078 | 1/1989 | Phelps, Jr. et al. | 257/668 |
| 4,875,138 | 10/1989 | Cusack | 174/52.4 |
| 5,016,084 | 5/1991 | Nakao | 257/787 |
| 5,144,412 | 9/1992 | Chang et al. | 357/74 |
| 5,151,559 | 9/1992 | Conru et al. | 257/690 |
| 5,196,725 | 3/1993 | Mita et al. | 257/672 |
| 5,214,845 | 6/1993 | King et al. | 257/664 |
| 5,227,662 | 7/1993 | Ohno et al. | 257/666 |

FOREIGN PATENT DOCUMENTS

| | | | |
|---|---|---|---|
| 8018949 | 2/1983 | Japan | 257/673 |
| 58-034953 | 3/1983 | Japan | 257/668 |
| 2192745 | 7/1990 | Japan | 257/668 |

Primary Examiner—Rolf Hille
Assistant Examiner—T. M. Arroyo
Attorney, Agent, or Firm—Leydig, Voit & Mayer

[57] ABSTRACT

A semiconductor device capable of accommodating a larger semiconductor chip in its package than a comparable conventional device and providing flexibility in the design of the semiconductor chip. An insulating tape includes an opening which receives a plurality of electrode pads disposed on the central part of the top surface of the semiconductor chip. The insulating tape is disposed between the semiconductor chip and inner leads of a lead frame. Circuit pattern traces are present on top of the insulating tape. The inner end of each circuit pattern trace is connected to a corresponding electrode pad with a fine metallic wire, and the outer end of each circuit pattern trace is connected to the corresponding inner lead.

6 Claims, 5 Drawing Sheets

SEMICONDUCTOR DEVICE

BACKGROUND OF THE INVENTION

1. Field of the Invention

The present invention relates to a semiconductor device having a semiconductor chip housed in a package of molded resin, and, more particularly, to the inner structure of the semiconductor device.

2. Description of the Related Art

FIG.9 is a perspective view of a conventional semiconductor device, with a portion cut away to show its inner structure. FIG.10 is an enlarged view of a portion of the internal structure of FIG.9. The semiconductor device shown in the figures is fabricated through wire bonding and transfer molding. A semiconductor chip 7 is die-bonded onto a diepad 12. The diepad 12 and leads 5 are integral parts of a lead frame. A plurality of electrode pads 8 are disposed along the top edge portion of the semiconductor chip 7. The inner leads 5a of the leads 5 extend inwardly toward the semiconductor chip 7 from a circumference of the device. Each of the electrode pads 8 on the semiconductor chip 7 is connected to a corresponding inner lead 5a by a metallic Fine wire 6. The semiconductor chip 7 is then sealed into a package made of epoxy resin or the like.

In a wire bonding process, metallic fine wires, typically gold (Au) wires of 25 μm diameter to 30 μm diameter, are used. The metallic fine wire penetrates a bonding tool called a capillary (not, shown), and the end of the metallic fine wire 6 at the capillary tip is melted and takes a spherical form.

Further in wire bonding process, ultrasonic energy is applied to perform bonding with the ball portion of the metallic fine wire 6 pressed on an electrode pad 8 on the semiconductor chip 7. The capillary is moved in accordance with an orbit with a predetermined shape, forming a curved loop. The metallic fine wire 6 is then pressed onto an inner lead 5a to which that wire 6 is to be connected, and ultrasonic energy is applied to bond the metallic fine wire 6, completing the full bonding process of one metallic fine wire 6.

One wire bonding process is performed in the above-described procedure. This process is repeated until all necessary interconnections are completed between each electrode pad 8 on the semiconductor chip 7 and the corresponding inner lead 5a. After that, in a transfer molding process, the above structure is sealed into a package 10 made of epoxy resin or the like.

The conventional semiconductor devices are constructed as mentioned above. In the conventional semiconductor devices, however, the inner leads must be routed around the semiconductor chip; space must be provided inside the package around the semiconductor chip, in order to allow metallic fine wires to be looped; and the electrode pads of the semiconductor chip must be arranged on peripheral edges of the semiconductor chip so that the metallic fine wires are not be shorted mutually, or to any of the components of the device. The above-described limitations of the conventional semiconductor device presents difficulty in increasing the size of the semiconductor chip without increasing its package size. Over the past several years, as integrated circuits have greatly increased in their level of integration and functional performance, the size of the semiconductor chip has commensurately increased. Contrary to the packaging consideration a downsizing of electronic equipment is more and more demanding requirements. The conventional semiconductor device which is fabricated using the wire bonding technique is unable to cope with the two contradictory requirements: the semiconductor chip must become larger, while its package must remain small.

SUMMARY OF THE INVENTION

The present invention has been developed to solve the above described problems. It is an object of the present invention to provide a packaged semiconductor device containing a larger semiconductor chip without increasing the package size.

The semiconductor device according to the present invention has its semiconductor chip installed inside a package with outer leads left exposed. The semiconductor device according to the present invention comprises: in its center the semiconductor chip having a top surface provided with a plurality of electrode pads; a plurality of leads, each formed of an inner lead and an outer lead integrally connected to the inner lead, the inner leads extending inwardly toward the semiconductor chip from the outside of the semiconductor chip and disposed in the same plane as the top surface of the semiconductor chip, the outer leads being left exposed for electrical connection with external devices; an insulating tape which, in its center portion, has an opening for receiving a plurality of electrode pads of the semiconductor chip, the insulating tape being disposed between the semiconductor chip and the inner leads so that the insulating tape covers both a portion of the semiconductor chip and a portion of each inner lead, with the insulating tape underside being glued onto the top sides of both the semiconductor chip and the inner leads, the insulating tape having, on its top surface, a plurality of circuit pattern traces, each trace extending from outside inwardly toward the opening, and having an inner end and an outer end; inner lead connection means for connecting the outer end of each circuit pattern trace on the insulating tape to a corresponding inner lead beneath the insulating tape; a metallic fine wire electrically connecting each electrode pad on the semiconductor chip to the inner end of a corresponding circuit pattern trace on the insulating tape; and a package which contains the above components with the outer lead of each lead left exposed.

In the semiconductor device according to the present invention, the insulating tape has, on its center portion, an opening so that the insulating tape does not directly cover the electrode pads disposed on the top surface the semiconductor chip. The insulating tape is laid between the semiconductor chip and the inner leads so that the insulating tape covers both a portion of the semiconductor chip and a portion of each inner lead. The circuit pattern traces are disposed on top of the insulating tape. The metallic fine wire is used to electrically connect the inner end of each circuit pattern trace to corresponding pad. The inner lead mechanism such as a bump is used to electrically connect the outer end of the circuit pattern trace to the corresponding inner lead. The above arrangement allows the inner leads to be routed substantially over the semiconductor chip, making it possible to accommodate a larger semiconductor chip in its package, compared to conventional devices. The semiconductor device achieves mechanically strong outer leads, compared to the TAB (Tape Automated Bonding) type device. Since the wire bonding technique is employed in the connection steps for the electrode pads, fabrication flexibility is increased, compared to TAB type devices. Since the electrode pads may be flexibly placed as required within the center portion of the top surface of the semiconductor chip, except the chip edge portions, constraints in designing the semiconductor chip are less demanding.

DETAILED DESCRIPTION OF THE PREFERRED EMBODIMENTS

Figure 1:
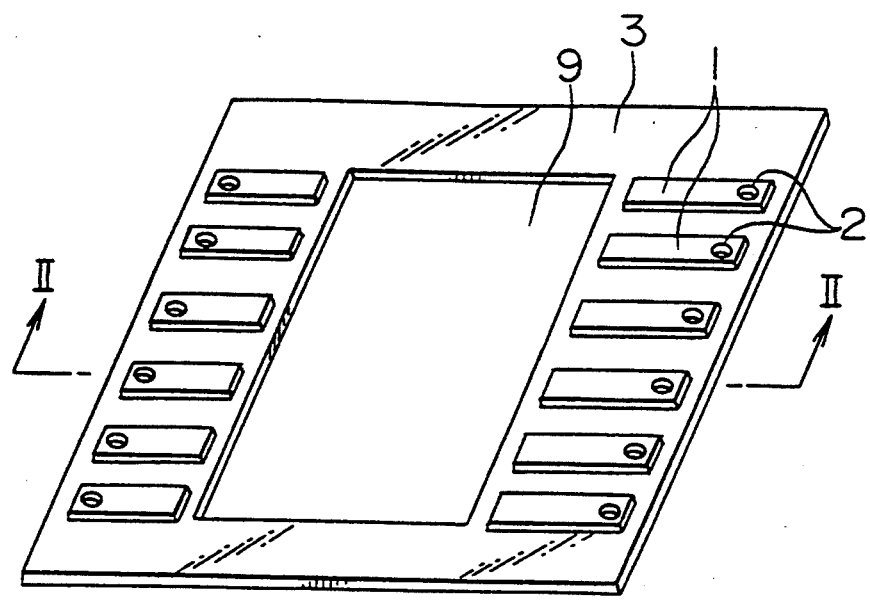
FIG. 1 is a perspective view showing an insulating tape employed in an embodiment of the semiconductor device according to the present invent ion.

Referring now to the drawings, embodiments of the present invention are described below.

Figure 2:
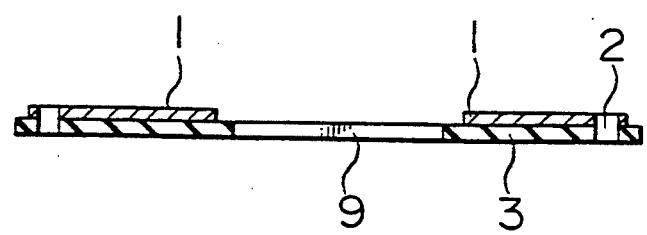
FIG. 2 is a cross-sectional view taken along line II—II in FIG. 1.

FIG. 1 is a perspective view showing an insulating tape used in an embodiment of the semiconductor device according to the present invention. FIG. 2 is a cross-sectional view taken along line II—II in FIG. 1. A plurality of circuit pattern traces 1 are formed on an insulating tape 3. The insulating tape 3 is made of, for example, polyimide. The circuit pattern traces 1 are made of a conductive metal film such as a copper (Cu) film. A through-hole 2 is disposed on the outer portion of each circuit pattern trace 1. The through-holes 2 which penetrate both the circuit pattern traces 1 themselves and the insulating tape 3 are provided to allow electrical connection between inner leads 5a which extend beneath the insulating tape 3 and the circuit pattern traces 1 (see FIG. 3 and FIG. 4). An opening 9 in the center of the insulating tape 3 is provided to allow electrical connection between each circuit pattern trace 1 and each electrode pad 8 on the semiconductor chip 7.

Figure 3:
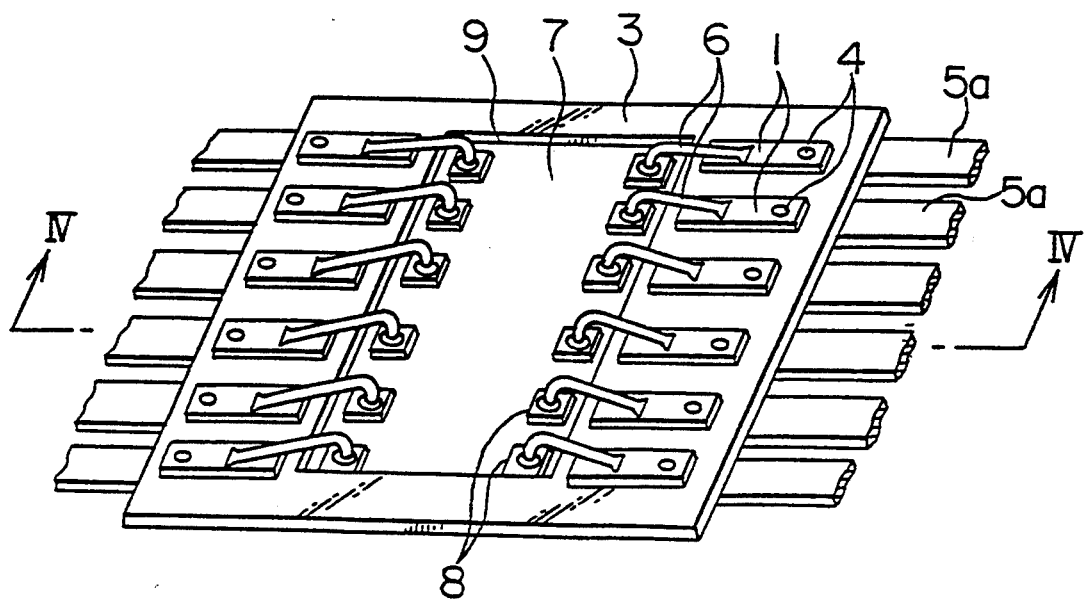
FIG. 3 is a perspective view showing an inner structure of the embodiment of the semiconductor device using the insulating tape illustrated in FIG. 1, according to the present invention.
Figure 4:
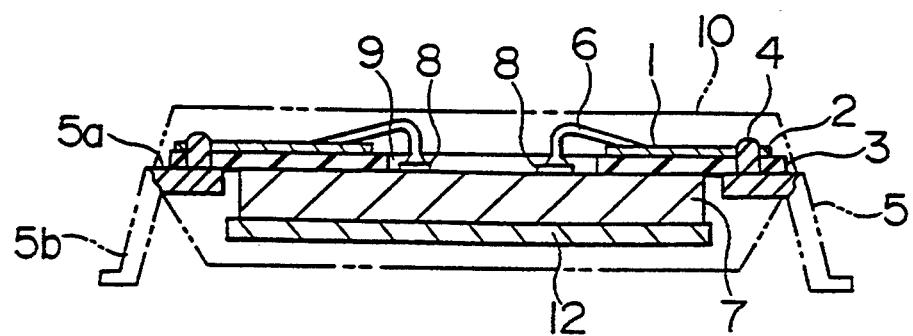
FIG. 4 is a cross-sectional view taken along line IV—IV in FIG. 3.

FIG. 3 is another perspective view showing the inner structure of the embodiment of the semiconductor device using the insulating tape of FIG. 1, according to the present invention. FIG. 4 is a cross-sectional view taken along line IV—IV in FIG. 3. In FIG. 3 and FIG. 4, a large size semiconductor chip 7 is die bonded onto a diepad 12. The semiconductor chip 7 has, on inside portions of its top surface, a plurality of electrode pads 8. The diepad 12 is recessed down from the plane of the inner leads 5a so that the top surface of the semiconductor 7 is flush with the inner leads 5a of the leads 5. The insulating tape 3 illustrated in FIG. 1 .and FIG. 2 is bonded onto both the semiconductor chip 7 .and the inner leads 5, for example, with an adhesive (not shown). Using wire bonding, a metallic fine wire 6 ,electrically connects each electrode pad 8 of the semiconductor chip 7, fitted into the opening 9 of the insulating tape 3, to a corresponding circuit pattern trace 1 at its inner end. A bump 4 disposed in each through-hole 2 of respective circuit pattern trace 1 connects that circuit pattern trace 1 on the insulating tape 3 to corresponding inner lead 5a attached beneath the insulating tape 3. The entire structure is then resin sealed into a package 10 as illustrated by dotted lines in FIG. 4, with the outer lead 5b of each lead 5 left exposed.

The structure of the device is again explained according to the sequence of its fabrication steps. The semiconductor chip 7 is first die bonded onto the diepad 12. The bump 4 is disposed into each of through-holes 2 of the insulating tape 3 to make an electrical connection between one circuit pattern trace 1 and a corresponding inner lead 5a. The bumps 4 are made of the same materials as the circuit pattern traces 1. The insulating tape which has already the bumps 4 attached is glued onto the semiconductor chip 7 and the inner leads 5a. Using thermocompression bonding, each bump 4 is connected to respective inner lead 5a, connecting each circuit pattern trace 1 of the insulating tape 3 to a respective inner lead 5a. Using wire bonding, the inner end of each circuit pattern trace 1 is connected to corresponding electrode pad 8 of the semiconductor chip 7 with the metallic fine wire 6 made of, for example, gold (Au). The structure is resin sealed in the package 10 with the outer lead 5b of each lead 5 left exposed.

The above arrangement allows leads 5 to be routed on the insulating tape 3, substantially over the semiconductor chip 7 inside the package 10, making it possible to accommodate a larger semiconductor chip 7. Since the leads 5 outside the insulating tape 3 are the heavy duty type reinforced with a lead frame, the leads 5 are mechanically strong, compared to the ones fabricated with the TAB technique only. Since wire bonding is employed to connect the electrode pads 8, more connection flexibility is allowed, compared to the TAB technique. Furthermore, since the electrode pads 8 may be flexibly placed as required within the center portion of the top surface of the semiconductor chip 7, except the chip edge portions, constraints in designing the semiconductor chip 7 are less demanding.

In the above embodiment, polyimide is used for the insulating tape 3. Alternatively, another type of insulating tape may be used if it has a heat resistant characteristic capable of withstanding 300° C. or so. Also, in the above embodiment, copper (Cu) is used for the circuit pattern trace on the insulating tape 3. As an alternative to copper, another type of conductor material may be used if it serves the purpose for wire bonding of the inner end of each circuit pattern trace 1 and for the bumps 4. In the above embodiment, it is assumed that both the bumps 4 and the circuit pattern traces 1 are of the same material. Alternatively, two different materials may be used for both if the circuit pattern traces 1 can be connected to the inner leads 5a.

In the above embodiment, each through-hole 2 and corresponding bump 4 provide each inner lead connection; and thermocompression bonding is employed to connect each bump 4 to the corresponding pattern trace 1 on the top side of the insulating tape 3 and to the corresponding inner lead 5a on the bottom of the insulating tape 3. An alternative method is employed as described below.

Figure 5:
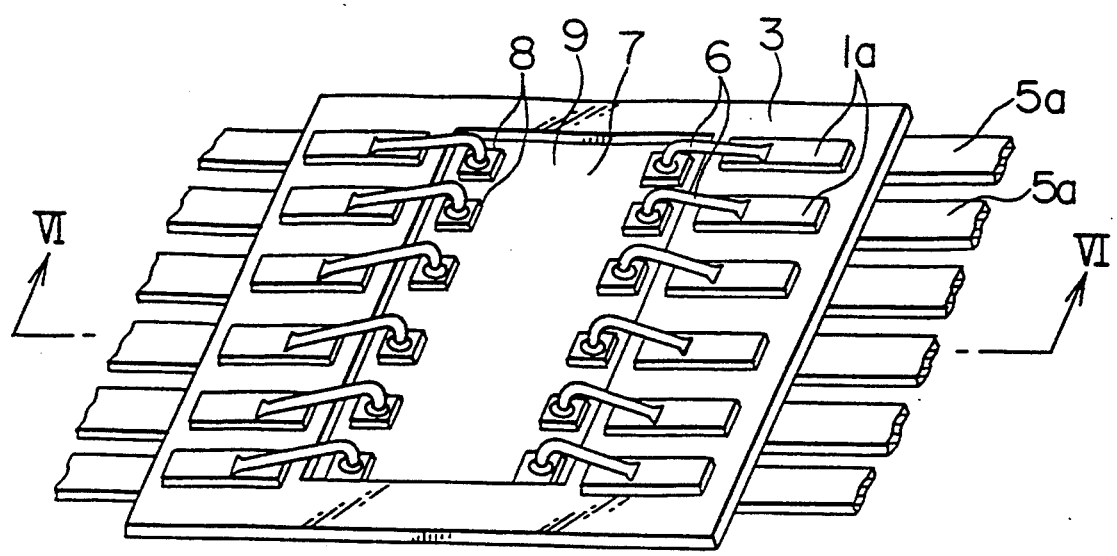
FIG. 5 is a perspective view showing an inner structure of another embodiment of the semiconductor device according to the present invention.
Figure 6:
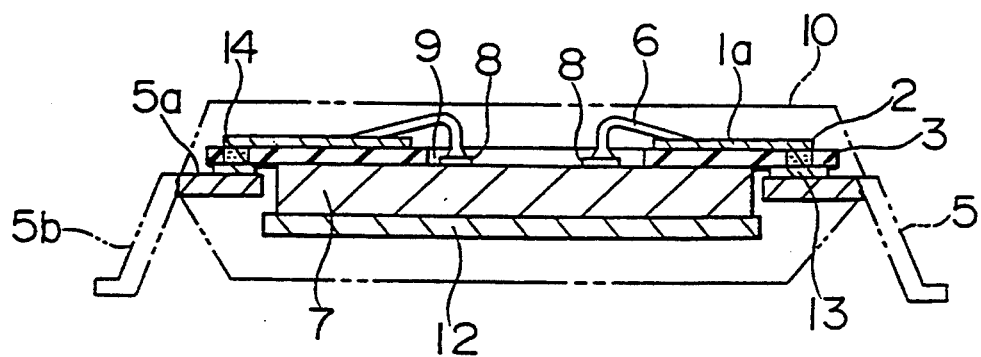
FIG. 6 is a cross-sectional view taken along line VI—VI in FIG. 5.

FIG. 5 is a perspective view showing an internal structure of a second embodiment of the semiconductor device according to the present invention. FIG. 6 is a cross-sectional view taken along line VI—VI in FIG. 5. In this embodiment, a plurality of circuit pattern traces 1a are formed on top of the insulating tape 3 while underside pattern traces 13 are correspondingly formed beneath the insulating tape 3; and a conductive adhesive agent 14 fills each through-hole 2 to make an electrical connection between one circuit pattern trace 1a and the respective underside circuit pattern trace 13. The underside circuit pattern traces 13 are directly connected to the inner leads 5a. The rest of the structure is identical to that of the first embodiment. The second embodiment offers the same advantages as the first embodiment.

Figure 7:
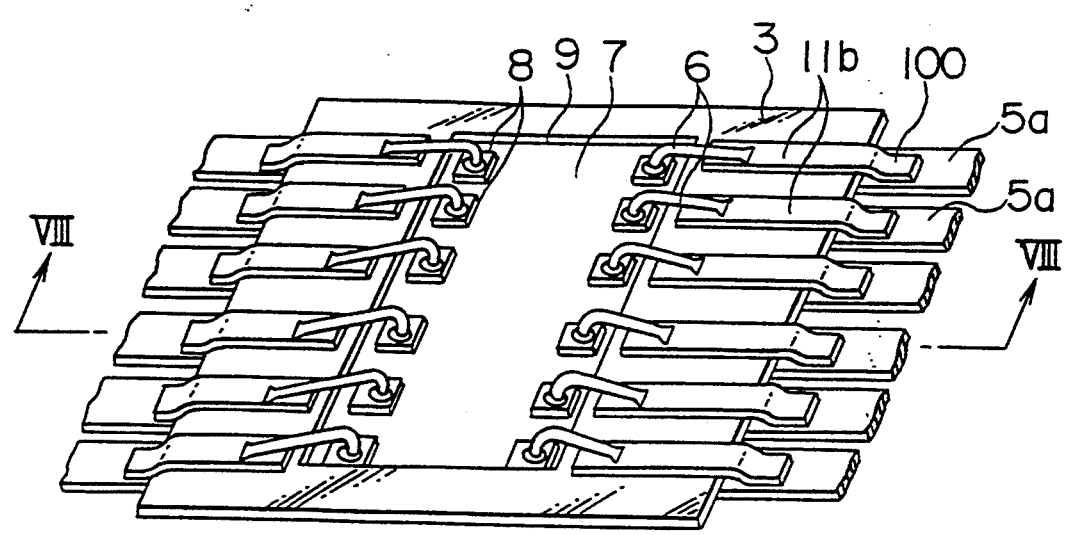
FIG. 7 is a perspective view showing an inner structure of yet another embodiment of the semiconductor device according to the present invention.
Figure 8:
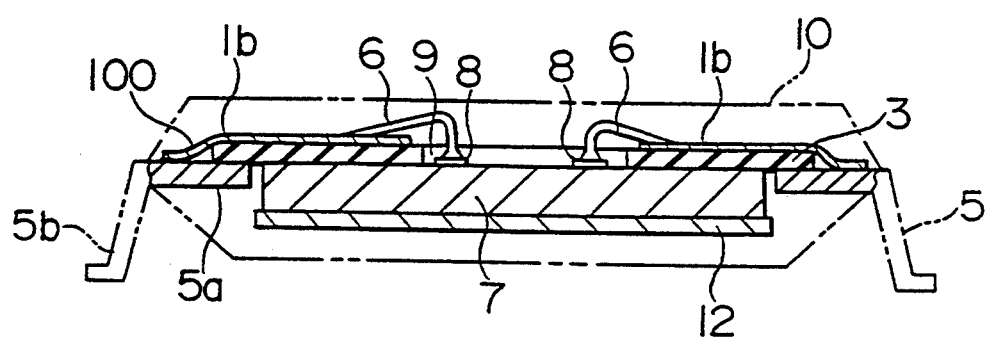
FIG. 8 is a cross-sectional view taken along line VIII—VIII in FIG. 7.
Figure 9:
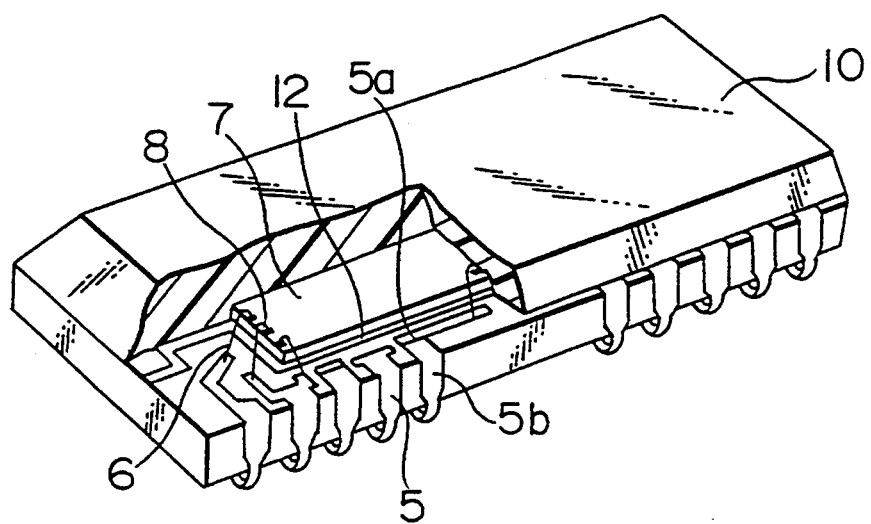
FIG. 9 is a perspective view of a conventional semiconductor device, with a portion cut away to show its internal structure.
Figure 10:
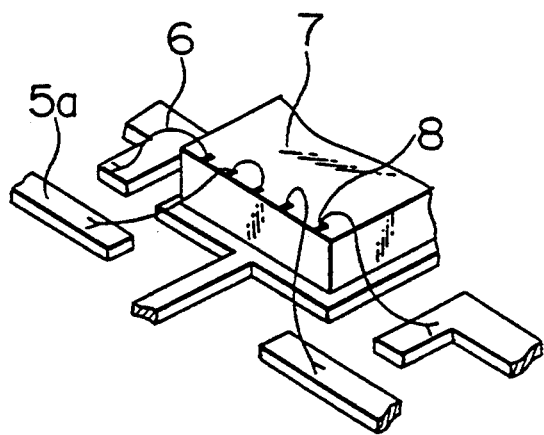
FIG. 10 is enlarged view of a part of the internal structure of FIG. 9.

FIG. 7 is a perspective view showing an internal structure of a third embodiment of the present invention. FIG. 8 is a cross-sectional view taken along line VIII—VIII in FIG. 7. In this embodiment, each circuit pattern trace 1b formed on top of the insulating tape 3 has an extension portion 100 which extends beyond the outer edge of the tape 3 and reaches over each inner lead 5a. This extension portion 100 is directly connected to respective inner lead 5a. Therefore, the insulating tape 3 is not provided with through-holes 2. The rest of the structure of the third embodiment is identical to that to the first and second embodiments. The third embodiment also offers the same advantages as the above-described embodiments.

In each of the above embodiments, the semiconductor chip 7 is mounted on the diepad 12. The same advantages may be achieved by a structure in which the semiconductor chip 7 is bonded to the insulating tape 3 with an adhesive (not shown) only, i.e., by the structure comprises a lead frame made up of the leads 5 with no diepad 12 employed.

In the semiconductor device of the present invention as detailed above, electrical connection, between a plurality of electrode pads disposed on the top surface of a semiconductor chip, on its central portion rather than on its edge portion, and inner leads disposed around the semiconductor chip, is performed by circuit pattern traces, located on top of the insulating tape, and thus extending over both the semiconductor chip and the inner leads, and by the metallic fine wires connected using wire bonding technique. Since the inner leads are routed substantially over the semiconductor chip, the device offers various advantages, i.e., the novel package is capable of accommodating a larger semiconductor chip than a comparable conventional package.

What is claimed is:

1. A packaged semiconductor device comprising:
   a semiconductor chip having opposed top and bottom surfaces, at least two edges, a plurality of electrode pads disposed on the top surface inwardly spaced from each of the two edges;
   an insulating tape having opposed top and bottom surfaces and a central opening, the bottom surface of the insulating tape being adhered to the top surface of the semiconductor chip between the electrode pads and the two edges with the electrode pads being disposed within the central opening and the insulating tape extending beyond the semiconductor chip at both of the two edges;
   a plurality of leads, each lead having an inner lead portion and an outer lead portion, the inner lead portions extending toward but spaced from the semiconductor chip, being bonded to the bottom surface of the insulating tape, and being substantially flush with the top surface of the semiconductor chip where bonded to the insulating tape;
   a plurality of electrically conducting traces disposed on the top surface of the insulating tape, each electrically conducting trace having an inner end extending toward the central opening and an outer end extending away from the central opening toward one of the inner lead portions of a lead;
   inner lead connection means electrically connecting the outer end of each trace on the top surface of the insulating tape to a corresponding inner lead portion on the bottom surface of the insulating tape;
   metallic wires electrically connecting respective electrode pads on the semiconductor chip to the inner ends of corresponding traces on the top surface of the insulating tape; and
   a package encapsulating the chip, traces, and insulating tape with the outer lead portions of the leads extending out of the package.

2. A semiconductor device according to claim 1 wherein said inner lead connection means comprises a through-hole penetrating both a trace on the insulating tape and the insulating tape and an electrically conducting bump disposed in the through-hole electrically connecting the trace on the insulating tape to the corresponding inner lead portion.

3. A semiconductor device according to claim 1 wherein said inner lead connection means comprises an underside electrically conducting trace, corresponding to a trace on the top side of the insulating tape, the underside trace being disposed on the bottom side of the insulating tape, a through-hole penetrating the insulating tape, a trace, and an underside trace, and a conductive adhesive filling the through-hole mechanically and electrically connecting the trace and the underside trace.

4. A semiconductor device according to claim 1 wherein said inner lead connection means comprises an extension of each trace beyond the insulating tape, reaching and contacting the corresponding inner lead portion so that each of said traces is electrically connected to the corresponding inner lead portion.

5. A semiconductor device according to claim 1 including a die pad bonded to the bottom surface of the semiconductor chip.

6. A semiconductor device according to claim 2 wherein the insulating tape is annular.

* * * * *